May 13, 1952 D. E. ROBERTS 2,596,510
VOLUME COMPRESSION CIRCUIT
Filed Aug. 23, 1947
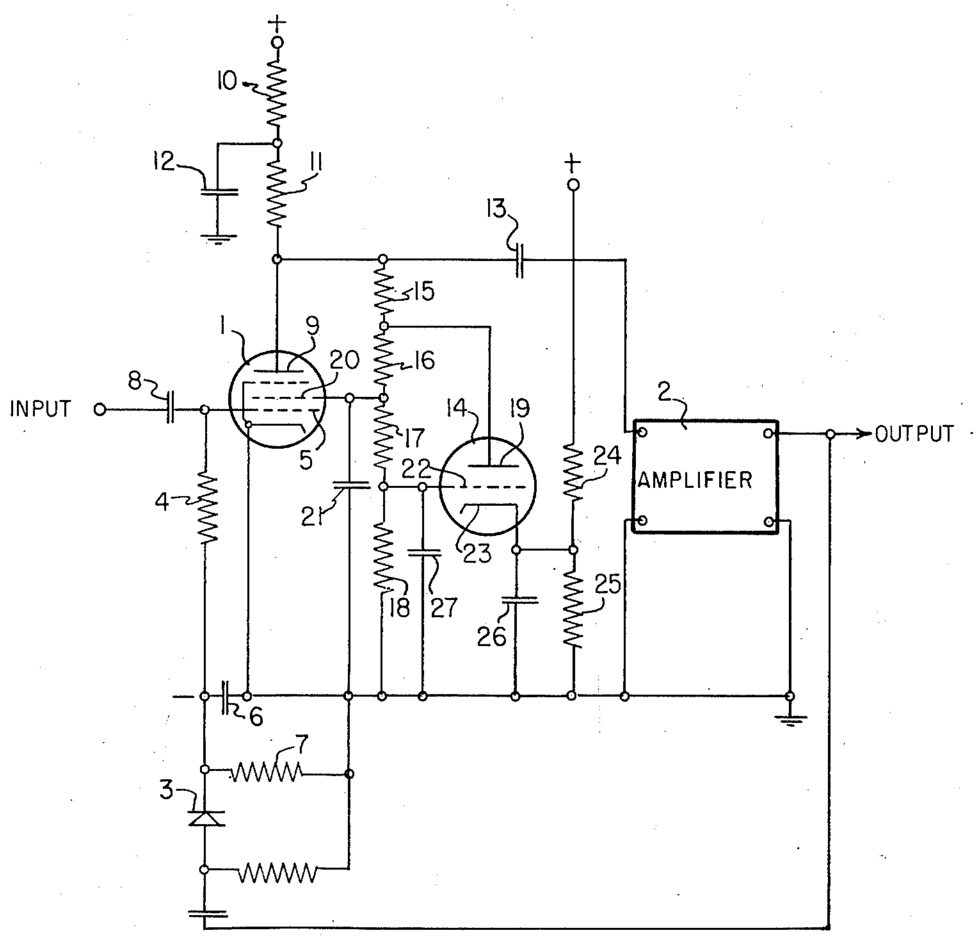
Inventor
David E. Roberts
By Foorman L. Mueller
Atty.

Patented May 13, 1952

2,596,510

UNITED STATES PATENT OFFICE 2,596,510

VOLUME COMPRESSION CIRCUIT

David E. Roberts, Chicago, Ill., assignor to Motorola, Inc., Chicago, Ill., a corporation of Illinois Application August 23, 1947, Serial No. 770,249

3 Claims. (Cl. 179—171)

This invention relates to automatic volume control circuits of the type known as volume compressors. Such circuits function to reduce the intensity of strong signals passed by an amplifier and to increase the strength of relatively weak signals passing through the amplifier.

In a volume compression circuit, it is desirable that the automatic volume control action respond instantaneously to increases in signal level. Accordingly, the circuit is so designed that the bias voltage supplied to the control grid of the controlled tube will rise very rapidly when there is a sudden rise in the signal level. In conventional volume compressors the sudden rise in bias voltage produces a steep wave-front transient which is objectionable to the listener, resulting in a momentary cut-off of the signal following each strong signal peak. It is not feasible to filter out this transient by placing a resistance-capacitance network between the rectifier and the control grid, since the time delay thus introduced would slow up the automatic volume control action.

Another problem which arises in the design of volume compression circuits is the tendency of the screen grid potential of the controlled tube to vary with changes in the control bias. Such action causes the operating point of the screen grid potential to be shifted out of the region of maximum curvature of the transfer characteristic, thereby diminishing the automatic volume control action. It has been proposed to avoid this difficulty by the use of a bleeder resistor between screen grid and ground, which minimizes the screen voltage fluctuations resulting from changes in screen current. This expedient, however, is objectionable because the bleeder current dissipates power and the circuit does not accommodate itself to ordinary variations in the operating characteristics among individual tubes of the same type.

An object of the present invention is to provide an improved volume compressor which functions to eliminate the undesirable effect of the steep wave-front transient without introducing any time delay in the action of the control circuit. I propose to accomplsh this by limiting the amplitude of the transient through the medium of a clipping circuit. I have observed that the amplitude of the transient is many times as great as that of the signal in combination with the normal biasing voltage, and hence it is possible to establish a limiting or clipping level which will serve to suppress the transient without affecting a true signal.

A further object of the present invention is to overcome the difficulty usually experienced with unstable screen grid voltages in volume compressors by means designed to introduce a bucking voltage in series with the screen dropping resistor voltage, thereby to stabilize the screen grid voltage.

Further objects, features and advantages of this invention will become apparent from the following description when taken in connection with the accompanying drawing which illustrates schematically a volume compression circuit utilizing the principles of the invention.

In carrying out the above stated objects of the invention, I arrange a clipper tube so that it is responsive to the plate voltage of the controlled amplifier tube in the automatic volume control circuit. This clipper tube draws its plate current through the plate resistor of the controlled tube. The screen grid voltage of the controlled tube is in turn controlled by current drawn through a dropping resistor in the plate circuit of the clipper tube. Sudden rises in plate voltage of the controlled tube, due to the aforesaid transient effect, are limited by the clipper tube to a level where they are not noticed by the listener. The signal voltages which are superimposed upon the normal control voltage are not affected by the clipper tube. The net effect is to provide a highly sensitive and stable volume compressor with virtually complete freedom from objectionable starting transient disturbances.

The illustrated arrangement comprises an audio volume compression circuit with a clipper for improving the performance thereof in accordance with the principles of the invention. The controlled portion of the circuit includes a variable-mu pentode 1, which is arranged to receive a control voltage or bias from a subsequent amplifier stage designated 2. A feed-back voltage derived from the output of the amplifier 2 is rectified by a suitable rectifier 3, and the negative, rectified voltage or bias is applied through a grid dropping resistor 4 to the control grid 5 of the tube 1. The capacitor 6 and resistor 7 together have a time constant sufficiently great to hold the bias between syllables or signal crests. The input signal, which is applied through a coupling capacitor 8 to the control grid 5, is superimposed upon the control bias. The plate 9 of the tube 1 draws its current from a suitable plate voltage source through an isolating resistor 10 and the plate or load resistor 11. The capacitor 12 is for isolation purposes only. The alternating component of the plate voltage of tube 1 is fed through a coupling capacitor 13 to the input terminal of the amplifier 2, which may comprise one or more stages of amplification as desired.

The clipper stage includes a high-mu triode 14 which is connected into the circuit in controlling relation to the pentode 1, as shown in the drawing. A voltage divider, comprising the series-connected resistors 15, 16, 17 and 18, is connected between the plate and cathode terminals of the tube 1. The plate 19 of the tube 14 is connected to the junction of the resistors 15 and 16. The screen grid 20 of the tube 1 is connected to the junction of the resistors 16 and 17 and is by-passed to ground by a capacitor 21. The control grid 22 of the tube 14 is connected to the junction of resistors 17 and 18 and is by-passed to ground by a capacitor 27. The cathode 23 of the tube 14 is connected to the junction of resistors 24 and 25, which are connected in series between the plate voltage source and ground to afford a voltage divider for the purpose of supplying the proper cathode bias for the tube 14. The by-pass capacitor 26 is connected in parallel with the resistor 25.

The triode 14 is biased to operate in the low plate-current, high plate-resistance region, with the result that normally it does not greatly load the plate circuit of the pentode 1. The presence of the by-pass capacitors 21 and 27 prevents any degeneration of signal voltages in consequence of the presence of the triode 14. It should be noted that the screen grid 20 of the tube 1 draws its current through the plate resistor 15 of the tube 14 and also through the resistor 16 in series therewith. Likewise, the tube 14 draws its plate current through the plate resistor 11 of the tube 1.

The characteristics of the triode 14 are such that if the plate voltage of the pentode 1 should rise above its normal value in an amount greater than, say, 20 volts, the tube 14 operates on the steep portion of its plate characteristic, with the result that it draws high plate current through the pentode plate resistor 11. Therefore, any undue rise or positive swing of the plate voltage of the tube 1, which might be produced as a result of the transient effect caused by a sudden increase in the bias voltage, is suppressed by virtue of the increased voltage drop in the resistor 11. Transient plate swings, if unchecked, may reach a value as high as 100 volts, whereas the true signal voltages combined with the D. C. plate voltage shifts of the tube 1 resulting from automatic volume control action remain well below 20 volts and are not affected by the action of the tube 14. Negative plate voltage swings of the tube 1 tend to be slower and do not cause audible transients; hence, no control thereof is required.

It has been mentioned hereinabove that the triode or clipper tube 14 stabilizes the screen grid voltage of the tube 1. When the grid of the pentode 1 receives a negative AVC voltage, the screen grid voltage tends to rise, due mainly to the reduction in screen current through the screen dropping resistors 15 and 16. Such a rise, however, raises the control grid voltage of the triode 14, causing an increase in the triode plate current through resistor 15. This produces a bucking voltage across resistor 15 which tends to restore the voltage of the screen grid 20 to its original value. The resulting stability of screen grid voltage is beneficial since it prevents the operating point of the pentode 1 from being shifted out of the critical region of maximum curvature of its transfer characteristic. Operation in this narrow region is necessary for good AVC sensitivity. This system preserves the advantage of the simple series screen dropping resistor used in ordinary pentode circuits, in that the circuit is able to adjust itself quite flexibly to variations among individual tubes of the same type.

From the preceding description it will be appreciated that I have provided a volume compression circuit which incorporates the above stated advantages and objects of the invention. I have found this control circuit particularly advantageous when employed in a transmitter monitoring system, although obviously it is capable of other uses as well.

While the invention has been specifically described with respect to a preferred embodiment thereof, it is to be understood that modifications and alterations can be made therein which are within the full intended scope of this invention as defined in the appended claims.

I claim:

1. In a volume compression circuit for an amplifier having a controlled stage and automatic biasing means for said stage, a variable-mu pentode in said controlled stage, a plate resistor through which said pentode draws its plate current, a plurality of resistors connected in series across the plate and cathode terminals of said pentode, said pentode having a screen grid arranged to draw current through certain of said series resistors, and a triode arranged to draw plate current through said pentode plate resistor and through a portion of said series resistors in common with said screen grid, said triode normally operating with low plate current and high plate resistance but being responsive to a positive swing of the pentode plate voltage exceeding a given amount for drawing high plate current thereby to limit such positive plate swings.

2. In a volume compression circuit for an amplifier having a controlled stage and automatic biasing means for said stage, a variable-mu pentode in said controlled stage, a plate resistor through which said pentode draws its plate current, resistance means connected across the plate and cathode terminals of said pentode, said pentode having a screen grid connected to an intermediate point on said resistance means to draw current through a portion thereof, and a triode having plate and grid electrodes connected to other points on said resistance means, said plate of said triode being connected to said resistance means at a point between the connection to said plate of said pentode and said intermediate point and said grid of said triode being connected to said resistance means at a point between the connection to said cathode of said pentode and said intermediate point, whereby said triode plate current is drawn through said pentode plate resistor and through a portion of said resistance means which is in common with said screen grid, said triode normally operating with low plate current and high plate resistance but being responsive to pentode plate voltage exceeding a given amount and to high pentode screen grid voltage for drawing high plate current thereby to limit such pentode plate and screen grid voltages.

3. In an amplifier having a controlled amplification stage and means for automatically applying a volume control voltage to said controlled stage from a subsequent stage of the amplifier to hold the output of said controlled stage within a desired range, and in which the volume control voltage may have steep wave fronts which tend to cut off said controlled amplification stage, a system for limiting the effect of said steep wave fronts including in combination, an amplifier tube in said controlled stage including a plate and a cathode, first resistance means connecting said plate to a source of potential and operating to drop the voltage of said plate below the voltage of said source when current is drawn therethrough and allowing the voltage of said plate to approach the voltage of said source when said amplifier tube is cut off, voltage divider means connected across said plate and said cathode of said amplifier tube, a triode tube having a plate and a grid, said plate of said triode tube being connected to a first intermediate point on said voltage divider means so that a portion of the voltage at said plate of said amplifier tube is applied to said plate of said triode tube, said grid of said triode tube being connected to a second intermediate point on said voltage divider means between said first intermediate point thereon and the end thereof connected to said cathode of said amplifier tube and providing a bias for said triode tube, said first resistance means and the portion of said voltage divider means between said plate of said amplifier tube and said first intermediate point thereon providing a path for the plate current of said triode tube, said first and second intermediate points on said voltage divider means applying potentials to said plate and said grid of said triode tube so that the plate current of said triode tube is low when said amplifier tube is operating with the output thereof within the desired range, with the voltage applied to said plate and grid of said triode from said voltage divider means increasing when the plate voltage of said amplifier tube increases above the desired range to cause substantially increased plate current through said triode and through said resistance means, and thereby increasing the voltage drop across said resistance means to reduce the plate voltage of said amplifier tube.

DAVID E. ROBERTS.

REFERENCES CITED

The following references are of record in the file of this patent:

UNITED STATES PATENTS

| Number | Name | Date |
|---|---|---|
| 2,092,496 | Branson | Sept. 7, 1937 |
| 2,179,263 | Koch | Nov. 7, 1939 |
| 2,214,608 | Bull | Sept. 10, 1940 |
| 2,315,042 | Boucke | Mar. 30, 1943 |
| 2,360,466 | Bedford | Oct. 17, 1944 |
| 2,363,985 | Moser | Nov. 28, 1944 |
| 2,383,309 | Hathaway | Aug. 21, 1945 |
| 2,397,830 | Bailey | Apr. 2, 1946 |
| 2,420,248 | Koch | May 6, 1947 |